Nov. 11, 1969 E. C. REICHART 3,478,276

AUTOMATIC PHASE CONTROL CIRCUIT

Filed Jan. 10, 1968

Inventor
ELWOOD C. REICHART.

BY Mueller, Aichele and Rauner
ATTYS.

United States Patent Office 3,478,276
Patented Nov. 11, 1969

3,478,276

AUTOMATIC PHASE CONTROL CIRCUIT

Elwood C. Reichart, Chicago, Ill., assignor to Motorola, Inc., Franklin Park, Ill., a corporation of Illinois Filed Jan. 10, 1968, Ser. No. 696,826
Int. Cl. H03b 3/04
U.S. Cl. 331—11 10 Claims

ABSTRACT OF THE DISCLOSURE

An automatic frequency control circuit is responsive only to the trailing edge of a sampling signal so that sine waves or other long period waves can be used as the sampling signal. In this system short pulse sampling signals are not required.

Background of the invention

Figure 1:
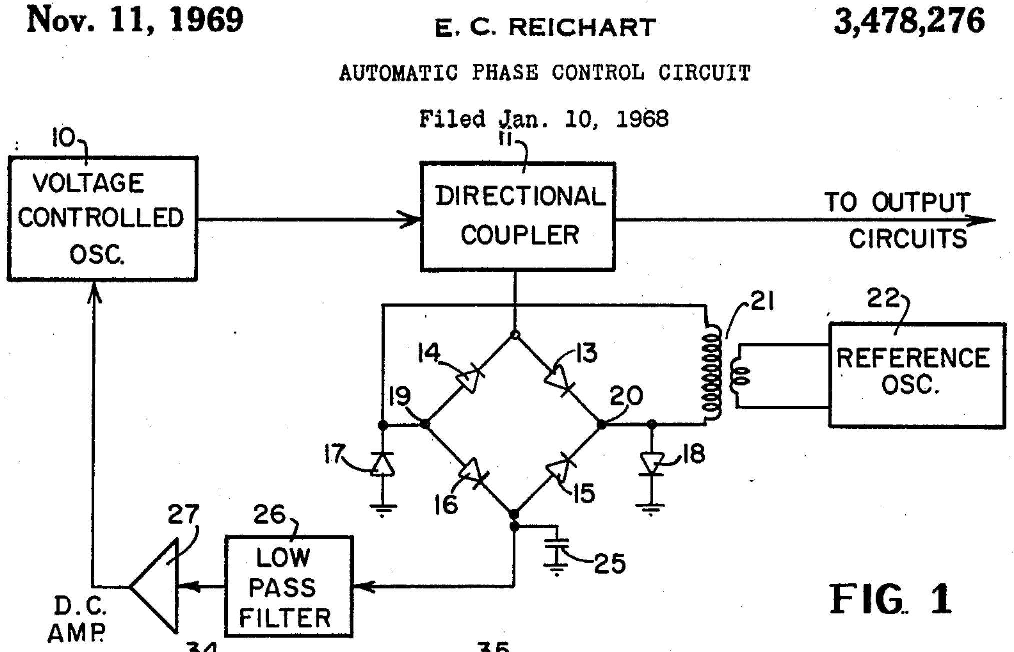

In order to provide information to control the frequency of the output signal of an oscillator, it has been the custom to sample the frequency of the oscillator signal at fixed intervals which are determined by a reference signal. If the oscillator signal is out of phase with, or is not of the same frequency as, the reference signal (or a haromnic of the reference signal) the amplitude of each sample will change and an error signal will be developed. This error signal is used to control the output frequency of the oscillator to reduce the difference between the frequency of the reference signal (or a harmonic of the reference signal) and the frequency of the oscillator signal to a minimum value.

In prior art circuits the sampling period has been made very short, less than one-half of a cycle of the signal being sampled, so that the change in the sampled signal during the period of sampling will be small. For frequencies of the order of 500 megacycles or more sampling pulses of the order of 1 nanosecond or less are required. The complex pulse circuitry required to develop and use 1 nanosecond pulses has made such sampling systems undesirable. Further, the harmonics present in pulses of the order of 1 nanosecond are easily picked up by other portions of the system to develop spurious signals therein which are also highly undesirable. Systems using mixers have been substituted for the pulse sampling systems, however the mixer systems have a low conversion efficiency and are undesirable for this reason. In addition, the mixer systems require a relatively large amount of circuitry.

Summary of the invention

It is, therefore, an object of this invention to provide an improved automatic frequency control circuit in which the signal being controlled is sampled over a time period greater than one cycle of the signal.

Another object of this invention is to provide an automatic frequency control circuit in which the reference signal controlling the sampling period is a sine wave.

In practicing this invention a circuit is provided for automatic frequency control of an oscillator. The automatic frequency control system includes a switching circuit coupling a portion of the oscillator output signal to a sample storage means. The switching circuit is also coupled to a reference oscillator which provides a reference signal for periodically closing the switch circuit to apply the portion of the output signal to the sample storage means. The signal stored in the storage means during the time the switching circuit is open is filtered in a low pass filter, amplified and applied to the oscillator to control the frequency thereof. The reference signal has a fundamental frequency less than the frequency of the oscillator and acts to close the switching circuit for a period of time longer than the period of one cycle of the oscillator signal. The reference signal can be a sine wave or if desired other wave shapes may be used, such as a sawtooth or triangular wave. In another embodiment of the invention the frequency of the reference signal is a subharmonic of the frequency of the oscillator signal minus an offset frequency. A second reference signal having a frequency equal to the offset frequency is provided. The output of the switching circuit is compared with the signal from the second oscillator to develop a signal which controls the frequency of the oscillator signal.

Figure 3:
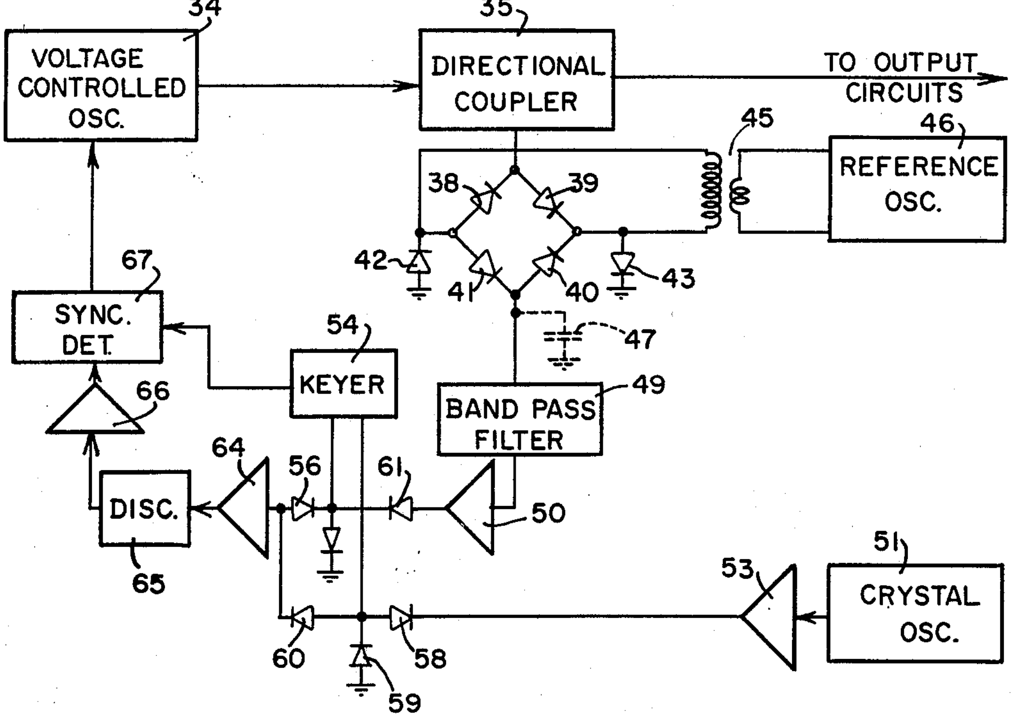

The invention is illustrated in the drawings of which:

FIG. 1 is a partial schematic and partial block diagram of an embodiment of the invention useful for automatic phase and frequency control;

FIGS. 2*a* and 2*b* are curves illustrating the operation of the circuit of FIG. 1; and FIG. 3 is a partial schematic and partial block diagram of another embodiment of the invention useful for frequency control of a modulated signal.

Referring to FIG. 1, a voltage controlled oscillator 10 develops an output signal of a particular desired frequency which is coupled to output circuits for use thereby through directional coupler 11. Directional coupler 11 couples a portion of the output signal to a diode bridge switch consisting of diodes 13–18. With a positive potential applied to terminal 19 and a negative potential applied to terminal 20, diodes 13–16 are biased to conduction and diodes 17 and 18 are biased to non-conduction so that a portion of the output signal from directional coupler 11 is coupled to capacitor 25 and low pass filter 26. With a positive potential applied to terminal 20 and a negative potential applied to terminal 19, diodes 13–16 are biased to non-conduction and diodes 17 and 18 are biased to conduction. In this state signals from directional coupler 11 are not coupled to capacitor 25 and low pass filter 26.

The output of low pass filter 26 is amplified by DC amplifier 27 and the resulting control signal is coupled to voltage controlled oscillator 10 where it is used to control the frequency of oscillator 10 in a known manner. Reference oscillator 22 develops a reference signal which is coupled through transformer 21 to terminals 19 and 20 of the diode switch. The reference signal provides the bias potentials to terminals 19 and 20 to alternately open and close the diode switch as previously described.

In FIG. 2*a* there is shown the output of the diode switch applied to low pass filter 26 and capacitor 25. With diodes 13–16 conducting the time constant of the diode switch input circuit and capacitor 25 is such that the potential on capacitor 25 follows the input signal. With diodes 13–16 non-conducting capacitor 25 remains charged at the last potential received from the diode switch. The output of the diode switch, with diodes 13–16 conducting, is shown as 30 in FIG. 2*a* while the output of the diode switch, with the diodes 13–16 non-conducting, is shown as 31 in FIG. 2*a*. The signal 30 represents the portion of the output signal from oscillator 10 coupled to the diode switch by directional coupler 11. In FIG. 2*b* the output of low pass filter 26 is shown. With diodes 13–16 conducting the low pass filter rejects the high frequency signal from oscillator 10 so that the output of low pass filter 26 is zero during the period diodes 13–16 are conducting. During the period diodes 13–16 are non-conducting, the potential on capacitor 25 remains constant and is shown as 32 in FIG. 2*b*. When the reference signal is a sine wave the average DC output signal from low pass filter 26 is one-half of the value of the potential 32 and this potential is amplified and used to control the frequency of oscillator 10 in a known manner.

Figure 2:
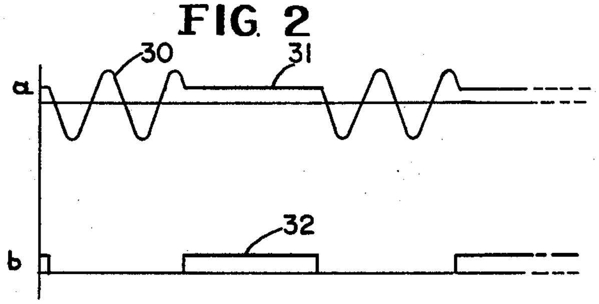

In the condition shown in FIG. 2, the frequency of the signal from voltage controlled oscillator 10 is equal to a harmonic of the reference signal from reference oscillator 22. Thus the potential level 31 does not change from cycle to cycle as the reference signal closes the diode gate at the same point in the output signal. However, if the frequency of the output signal is not equal to a harmonic of the reference oscillator signal, the potential 31 varies from cycle to cycle of the reference signal at a rate equal to the difference between the harmonic of the reference oscillator and the voltage controlled oscillator. This AC component of the signal from the diode switch is rejected by low pass filter 26 reducing the amplitude of the signal 32 appearing at the output of the low pass filter. This rejection in the signal applied to voltage controlled oscillator 10 shifts the frequency of the oscillator to match a harmonic of the reference oscillator 22.

In prior art circuits using a sampling technique the sampling pulses for controlling the diode switch were made extremely small so that the switch would be open only during a very small portion of a cycle of the signal being sampled. In an example of the circuit described in FIG. 1, the output frequency of voltage controlled oscillator 10 may be of the order of 500 megacycles while the frequency of reference oscillator 22 may be a sine wave of the order of 100 megacycles. In prior art circuits pulses of the order of less than 1 nanosecond would be used to sample the output of voltage controlled oscillator 10. The pulse generating networks for such short pulses are extremely complex and the pulses themselves introduce spurious signals throughout the system which are difficult to remove. The reference oscillator 22 can be a simple sine wave oscillator and as such would not introduce spurious harmonics. Other waveforms could be used, such as a sawtooth, but since the period of time during which the signal from the reference oscillator opens the diode switch is very much longer than the period of the output signal from oscillator 10, the higher harmonics of the reference signal would be very low and would not cause troublesome spurious signals to be introduced into the system. In the system above, the diode switch could be open for 5 to 10 cycles or more of the output signal from oscillator 10, a period of from 10 to 20 nanoseconds or longer versus the requirement of less than 1 nanosecond in prior art circuits.

The circuit of FIG. 1 is useful where there is no modulation (but is not restricted to such a case) on the output signal from voltage controlled oscillator 10 and the output signal from voltage controlled oscillator 10 will be locked in both phase and frequency with the reference oscillator signal. In FIG. 3 there is shown a circuit useful for locking the frequency of a signal from voltage controlled oscillator 34 to reference oscillator 46, where the output signal from voltage controlled oscillator 34 has been modulated.

A portion of the output signal from oscillator 34 is coupled to the diode switching network by directional coupler 35. The diode switching network consists of diodes 38–41, forming a bridge circuit, and diodes 42 and 43. The diode switching circuit is operated by a reference signal from reference oscillator 46 coupled to the bridge circuit thorugh transformer 45. The operation is similar to the diode switching circuit described in FIG. 1 and with diodes 38–41 biased to conduction a portion of the output signal is coupled to bandpass filter 49 and capacitor 47. Capacitor 47 is a storage capacitor similar to capacitor 25 in FIG. 1. However, the storage capacitor may be included as part of the filter 49 and therefore is shown dotted in FIG. 3. Similarly capacitor 25 could have been included as part of filter 26 of FIG. 1.

The output of bandpass filter 49 is amplified in amplifier 50 and applied to a diode switch consisting of diodes 56, 57 and 61. The signal from a second reference oscillator 51 is amplified in amplifier 53 which is coupled to a second diode switch consisting of diodes 58, 59 and 60. Diode switch 58–60 is operated by a signal from keyer 54. With a positive potential applied from keyer 54 to diodes 58–60, diodes 58 and 60 are biased to conduction while diode 59 is biased to non-conduction permitting the signal from amplifier 53 to be coupled to amplifier 64. With a negative potential applied from keyer 54 to diodes 58 to 60, diodes 58 and 60 are biased to non-conduction while diode 59 is biased to conduction blocking the signal from amplifier 53. The switch consisting of diodes 56, 57 and 61 operate in a similar manner. Keyer 54 operates so that the signal from amplifier 50 and the signal from amplifier 53 are alternately coupled to amplifier 64.

The output of amplifier 64 is detected by discriminator 65, amplified in amplifier 66 and coupled to synchronous detector 67. Synchronous detector 67 is also coupled to keyer 54 and is keyed at the same rate as the diode switches 57–61 by a signal from keyer 54. The output of synchronous detector 67 is a control signal which is applied to voltage controlled oscillator 34 to lock the oscillator to the desired frequency.

In the system of FIG. 3 the frequency of the reference signal from reference oscillator 46 is harmonically related to the output frequency of voltage controlled oscillator 34 plus or minus an off-set frequency. Since the frequency of the output signal from voltage controlled oscillator 34 and reference oscillator 46 are not directly harmonically related, the potential appearing across capacitor 47, when the system is locked, will not be a fixed DC potential as in the circuit of FIG. 1 but will be an alternating current signal having the same frequency as the off-set frequency. Bandpass filter 49 is designed to pass the off-set frequency and reject the frequencies above and below this frequency, including the frequency of voltage controlled oscillator 34 and the fundamental frequency and harmonic frequencies of reference oscillator 46. For example, the frequency of the output signal from voltage controlled oscillator 34 may be 500 megacycles while the output of reference oscillator 46 may be 49 megacycles. The tenth harmonic of the reference signal will be 490 megacycles so that the offset frequency will be 10 megacycles. Bandpass filter 49 would be designed to pass 10 megacycles and reject the frequencies above and below this frequency.

A second reference oscillator 51 develops a second reference signal with a frequency equal to the offset frequency which is amplified in amplifier 53. The reference frequency from oscillator 51 and the output signal from bandpass filter 49 are alternately coupled to discriminator 65 to develop an output signal, the magnitude of which is dependent upon the frequency of the signals applied to discriminator 65. If both input signals to discriminator 65 have the same frequency they will both develop the same output potential and the output signal from discriminator 65 will be a DC signal. This form of detection is used since any drift of discriminator 65 will not affect the accuracy of the frequency comparison. If the two offset frequencies are the same, the discriminator output will be a DC signal and the output signal detected by synchronous detector 67 will be zero so that the voltage controlled oscillator 34 will remain at a particular frequency. However, if the offset frequency of the signal from bandpass filter 49 is different from the frequency of the reference signal from oscillator 51 the output signal from discriminator 65 will include an AC component which is a function of the frequency difference. Synchronous detector 67 detects the AC component as a DC signal and applies this DC signal to voltage controlled oscillator 34 to regulate this oscillator.

I claim:

1. An automatic frequency control circuit including in combination, first oscillator means for developing an output signal having a particular frequency, sample storage means, first switching circuit means coupling said sample storage means to said first oscillator, second oscillator means coupled to said switching circuit means and providing a first reference signal, said first reference signal being periodic and having a fundamental frequency less than said particular frequency, further each cycle of said first reference signal having a first portion and a second portion with said first portion having a longer time duration than one cycle of said output signal, said first switching circuit means being responsive to said first portion of said reference signal to couple periodically a portion of said output signal to said sample storage means for developing a first control signal, filter means coupled to said sample storage means for filtering said first control signal to develop a second control signal, and circuit means coupling said filter means to said first oscillator means, said circuit means and said first oscillator means being responsive to said second control signal whereby the frequency of said first oscillator means is regulated to a desired value.

2. The automatic frequency control circuit of claim 1 wherein the fundamental frequency of said first reference signal is harmonically related to said particular frequency.

3. The automatic frequency control circuit of claim 2 wherein, the first reference signal is a sine wave, and said filter means includes a low pass filter for rejecting said particular frequency and the fundamental and harmonic frequencies of said first reference signal.

4. The automatic frequency control circuit of claim 3 wherein, said first switching means includes a diode bridge circuit having a plurality of diodes and first and second pairs of opposite terminals connected to said diodes, one of said first pair of terminals being coupled to said first oscillator means and the other of said first pair of terminals being coupled to said sample storage means, said second oscillator means being coupled to said second pair of terminals for applying said first reference signal to said plurality of diodes to bias said plurality of diodes alternately to conduction and non-conduction.

5. The automatic frequency control circuit of claim 4 wherein, said sample storage means is a capacitor.

6. The automatic frequency control circuit of claim 1 wherein, the fundamental frequency of said first reference signal is harmonically related to said particular frequency minus an offset frequency.

7. The automatic frequency control circuit of claim 6 wherein, the first reference signal is a sine wave, and said filter means includes a bandpass filter having a bandwidth for passing said offset frequency and rejecting said particular frequency and the frequencies of said first reference signal and harmonics thereof.

8. The automatic frequency control circuit of claim 7 wherein, said first switching means includes a diode bridge circuit having a plurality of diodes and first and second pairs of opposite terminals connected to said diodes, one of said first pair of terminals being coupled to said first oscillator means and the other of said first pair of terminals being coupled to said sample storage means, said second oscillator means being coupled to said second pair of terminals for applying said first reference signal to said plurality of diodes to bias said plurality of diodes alternately to conduction and non-conduction.

9. The automatic frequency control circuit of claim 8 wherein, said sample storage means is a capacitor.

10. The automatic frequency control circuit of claim 9 wherein, said circuit means includes, second switching circuit means coupled to said bandpass filter, third oscillator means coupled to said second switching circuit means and providing a second reference signal of a frequency equal to said offset frequency, discriminator means coupled to said second switching means and synchronous detector means coupled to said second switching means and further coupling said discriminator means to said first oscillator means, said second switching means acting to connect said bandpass filter and said third oscillator means alternately to said discriminator means for supplying said second control signal and said second reference signals thereto, said discriminator means and said synchronous detector means being responsive to said second control signal and said second reference signal to develop a third control signal, said first oscillator means being responsive to said third control signal whereby the frequency of said first oscillator means is regulated to a desired value.

No references cited.

JOHN KOMINSKI, Primary Examiner

U.S. Cl. X.R.

331—26, 30, 18; 332—19